(12) United States Patent
Wen et al.

(10) Patent No.: US 7,199,735 B1
(45) Date of Patent: Apr. 3, 2007

(54) METHOD AND APPARATUS FOR ENTROPY CODING

(75) Inventors: Jiangtao Wen, La Jolla, CA (US); Rui Zhang, Pleasanton, CA (US)

(73) Assignee: Mobilygen Corporation, Santa Clara, CA (US)

( * ) Notice: Subject to any disclaimer, the term of this patent is extended or adjusted under 35 U.S.C. 154(b) by 0 days.

(21) Appl. No.: 11/271,252

(22) Filed: Nov. 12, 2005

Related U.S. Application Data (60) Provisional application No. 60/711,332, filed on Aug. 25, 2005.

(51) Int. Cl.
*H03M 7/00* (2006.01)

(52) U.S. Cl. .................................... 341/107; 704/500

(58) Field of Classification Search ............... 341/50, 341/65, 63, 107, 106; 375/240; 348/391.1, 348/384; 704/500

See application file for complete search history.

(56) References Cited

U.S. PATENT DOCUMENTS

| | | | | | |
|---|---|---|---|---|---|
| 5,748,242 | A | * | 5/1998 | Podilchuk | 348/391.1 |
| 5,850,258 | A | * | 12/1998 | Kang | 375/240.01 |
| 6,016,111 | A | * | 1/2000 | Park et al. | 341/55 |
| 6,349,284 | B1 | * | 2/2002 | Park et al. | 704/500 |
| 6,498,809 | B1 | * | 12/2002 | Dean et al. | 375/240 |
| 6,677,868 | B2 | * | 1/2004 | Kerofsky et al. | 341/107 |
| 6,934,334 | B2 | * | 8/2005 | Yamaguchi et al. | 375/240.16 |
| 6,975,254 | B1 | * | 12/2005 | Sperschneider et al. | 341/107 |

\* cited by examiner

*Primary Examiner*—Peguy JeanPierre
(74) *Attorney, Agent, or Firm*—Christopher P. Maiorana, PC

(57) ABSTRACT

A method for performing entropy coding comprising the steps of (A) receiving an input stream and side information, (B) analyzing the side information to determine all constraints associated with the side information and (C) replacing the input stream with an index to a list of the number of valid input streams that satisfy all constraints associated with each specific type of the side information.

27 Claims, 6 Drawing Sheets

152
ANALYZE SIDE INFORMATION AVAILABLE IN A COMPRESSION SYSTEM

154
DETERMINE A NUMBER OF CODE WORD SEQUENCES SATISFYING ALL CONSTRAINTS ASSOCIATED WITH THE SIDE INFORMATION BASED UPON THE ANALYSIS

156
GENERATE A LIST OF VALID CODE WORD SEQUENCES INCLUDING THE NUMBER OF CODE WORD SEQUENCES THAT SATISFY ALL CONSTRAINTS ASSOCIATED WITH EACH SPECIFIC TYPE OF SIDE INFORMATION (E.G., CONSTRAINT ON THE LENGTH OF CODE WORD SEQUENCES, SEMANTIC CONSTRAINTS, SYNTACTIC CONSTRAINTS, ETC.)

158
REPLACE EACH CODE WORD SEQUENCE OF AN INPUT STREAM WITH AN ENTROPY CODED INDEX TO THE LIST OF VALID CODE WORD SEQUENCES

METHOD AND APPARATUS FOR ENTROPY CODING

This application claims the benefit of U.S. Provisional Application No. 60/711,332, filed Aug. 25, 2005.

FIELD OF THE INVENTION

The present invention relates to a method and/or architecture for data compression generally and, more particularly, to a method and/or apparatus for entropy coding.

BACKGROUND OF THE INVENTION

Variable length codes (VLCs) are widely used in data compression systems such as JPEG, MPEG, etc. Variable length codes are usually designed for individual syntax fields (i.e., motion vector information, transform coefficient information in video compression systems, etc.) of the bit streams, and for individual elements (i.e., individual elements of a long sequence of samples from an independently and identically distributed source) of a syntax field. When compressing an input signal, conventional approaches concatenate code words for each of the individual elements to form an output bit stream. Different code words for different syntax fields can be interleaved.

Conventional approaches have a number of drawbacks that can result in loss of compression performance. One such drawback is that restrictions imposed by syntax and semantics on the validity of code word concatenations cannot be considered in the design of each individual code table when the code tables for individual syntax elements are designed. Treating the entropy coding by concatenation of code words as a single integrated black box for performing entropy coding, the injection (or element to element mapping function) between the input data stream and the output bit stream (i.e., a "black box code book (BBXCB)") used by the black box constitutes a VLC. The BBXCB contains code word concatenations that, even though not valid for semantic or syntactic reasons, are valid from a pure code word concatenation perspective. The existence of such code words inevitably lowers the entropy coding efficiency of the black-box.

In addition to code word concatenations that can be invalid based on syntactic and semantic constraints, a second drawback of the conventional approaches is that the possible number of code words for each code word length is regulated by the Kraft's inequality. The conventional approaches presume that no external code word or packet length information is available and, therefore, code word boundaries can only be determined based on code word design, such as a prefix condition.

It would be desirable to have a solution that uses syntactic and semantic constraints and/or side information about packet length to achieve a shorter representation of an input stream than the conventional approach.

SUMMARY OF THE INVENTION

The present invention concerns a method for performing entropy coding comprising the steps of (A) receiving an input stream and side information, (B) analyzing the side information to determine all constraints associated with the side information and (C) replacing the input stream with an index to a list of the number of valid input streams that satisfy all constraints associated with each specific type of the side information.

The objects, features and advantages of the present invention include providing a method and/or apparatus for entropy coding that may (i) provide a new method for entropy coding, (ii) use entropy coding without actually directly using code word concatenations as in conventional systems, (iii) take into account side information available in a real multimedia compression system, (iv) use information otherwise ignored in the design of entropy coding tables in conventional schemes and/or (v) significantly improve entropy coding efficiency.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide a method for performing entropy coding with prefix variable length codes (VLCs) that may avoid the drawbacks of conventional approaches. In contrast to conventional approaches, where a concatenation (or sequence) of code words is used (e.g., stored or transmitted) to represent a concatenation (or sequence) of input samples, the present invention may utilize side information (e.g., the length of the code word concatenations and/or syntactic and semantic constraints) to achieve a shorter representation of the input. In one example, the shorter representation of the input may be obtained through low complexity table look up and comparison operations. The terms concatenation and sequence as used herein may imply arrangement of elements in a predetermined order. For example, syntax generally defines a normative order.

Figure 1:
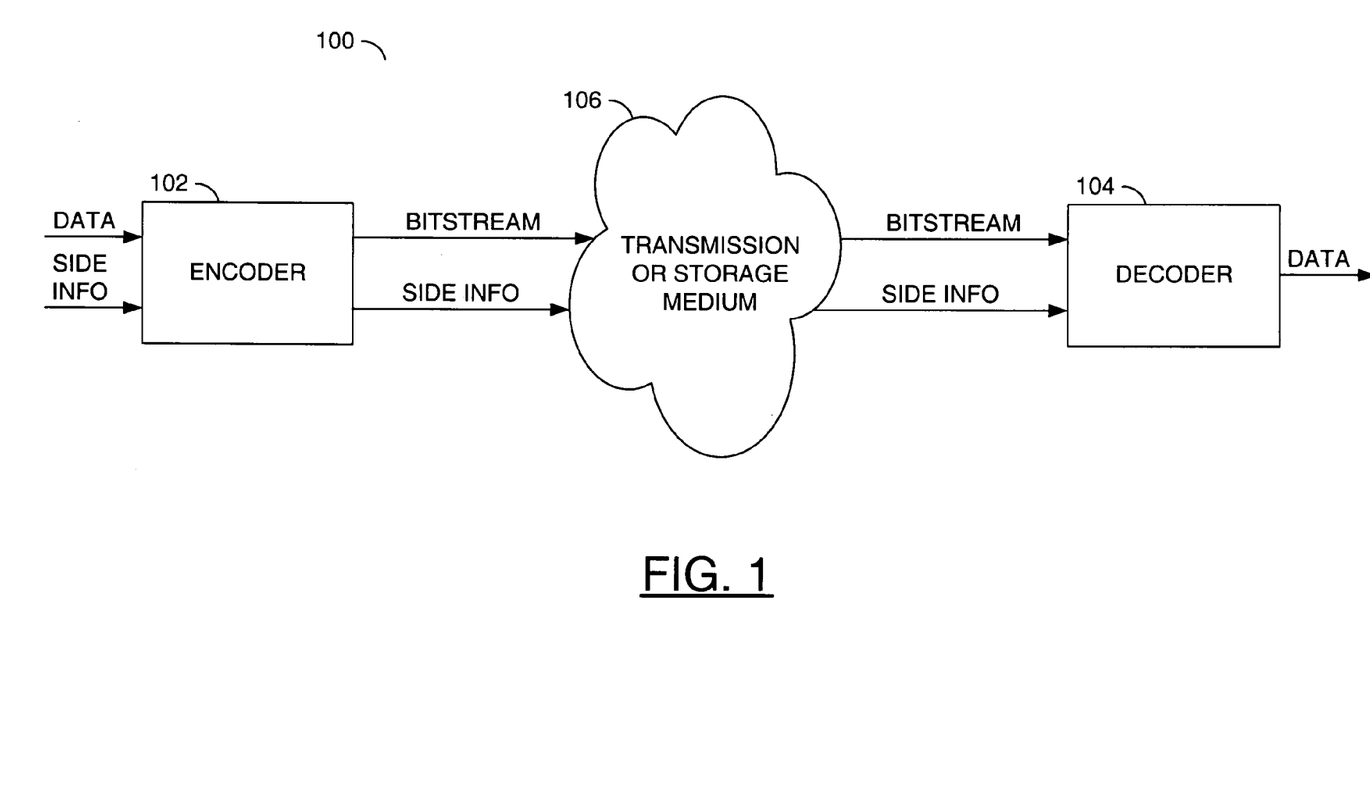
FIG. 1 is a block diagram illustrating a preferred embodiment of the present invention.

Referring to FIG. 1, a block diagram is shown illustrating a system 100 in accordance with a preferred embodiment of the present invention. The system 100 may be implemented, in one example, as an end-to-end system. The system 100 may comprise a circuit (or block) 102, a circuit (or block) 104 and a transmission or storage medium 106. The circuit 102 may be implemented as an encoder circuit. The circuit 104 may be implemented as a decoder circuit. In one example, the system 100 may be implemented as part of a recorder/player device. In another example, the encoder 102 and the decoder 104 may be implemented as separate devices.

When designing an end-to-end system employing the present invention, syntactic and semantic constraints may be analyzed via (i) a recursive process and (ii) a number of tables storing the number of valid black-box outputs satisfying specific side information. Following the analysis, each input may be mapped to a coded representation in the form of an output bit stream by the encoder 102. In one example, the mapping may be performed using a recursive process. The reverse process may be performed at the decoder 104 when decoding.

The encoder 102 may have a first input that may receive a signal (e.g., DATA), a second input that may receive a signal (e.g., SIDE_INFO), a first output that may present a signal (e.g., BITSTREAM) and a second output that may present the signal SIDE_INFO. The signal DATA may be implemented as a data signal. In one example, the signal DATA may comprise audio, video and/or any other appropriate data. The signal SIDE_INFO may comprise side information about the data contained in the signal DATA. For example, the signal SIDE_INFO may comprise the length of code word concatenations (e.g., when the signal DATA is encoded with conventional entropy coding such as VLCs), syntactic and semantic constraints, and/or other constraints on the data in the signal DATA. The signal BITSTREAM may be implemented as an output bit stream. The encoder 102 may be configured to generate the signal BITSTREAM in response to the signals DATA and SIDE_INFO.

The circuit 104 may have a first input that may receive the signal BITSTREAM, a second input that may receive the signal SIDE_INFO and an output that may present the signal DATA recovered from the signal BITSTREAM. The decoder 104 may be configured to generate the signal DATA in response to the signals BITSTREAM and SIDE_INFO.

The transmission and/or storage medium 106 may be configured to couple the circuits 102 and 104. the transmission and/or storage medium 106 may comprise a network medium (e.g., ethernet, IEEE 1394, USB, etc.), a broadcast medium (e.g., cable, satellite, etc.) and/or a storage medium (e.g., optical drive, hard drive, personal data recorder, etc.).

Figure 2:
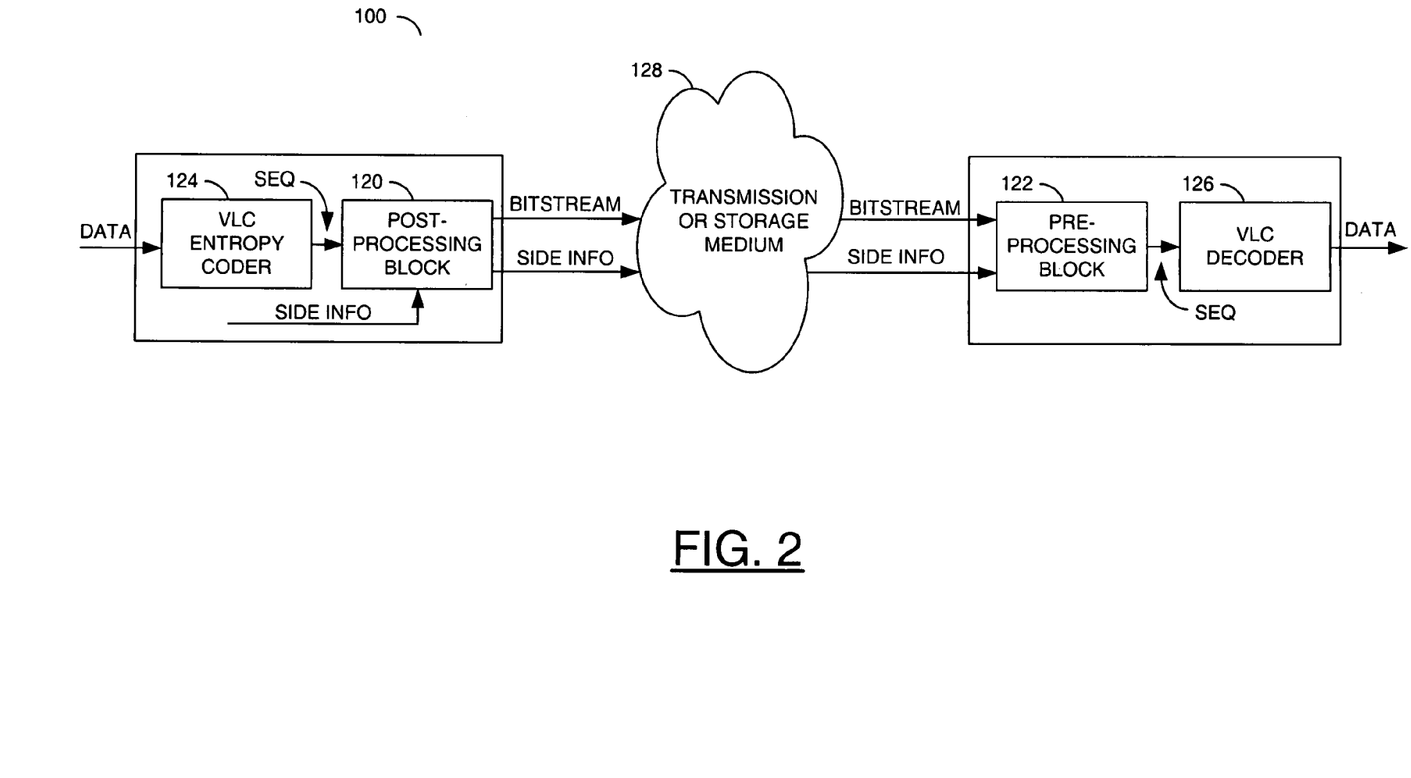
FIG. 2 is a block diagram illustrating another preferred embodiment of the present invention.

Referring to FIG. 2, a block diagram is shown illustrating a system 100' in accordance with another preferred embodiment of the present invention. The system 100' may comprise a circuit (or block) 120, a circuit (or block) 122, a circuit (or block) 124, a circuit (or block) 126 and a transmission and/or storage medium 128. The circuit 120 may be implemented, in one example, as a post-processing circuit (or block). The circuit 122 may be implemented, in one example, as a pre-processing circuit (or block). The circuit 124 may be implemented as a VLC entropy coder circuit (or block). The circuit 126 may be implemented as a VLC decoder circuit (or block).

The circuit 120 may have a first input that may receive a signal (e.g., SEQ), a second input that may receive the signal SIDE_INFO, a first output that may present the signal BITSTREAM and a second output that may present the signal SIDE_INFO. In one example, the signal SEQ may be implemented as either (i) a sequence (or concatenation) of code words of a variable length code (VLC) or (ii) a sequence of the information the code word concatenation represents. In another example, the signal SEQ may comprise one or more coded representations such as variable length codes (VLCs), arithmetic codes (AC), adaptive VLC bit streams, and/or adaptive AC bit streams.

The circuit 120 may be configured to generate the signal BITSTREAM in response to the signals SEQ and SIDE_INFO. The circuit 120 may be configured to produce a shorter output bit stream via (i) a recursive process and (ii) a number of tables storing a number of valid black-box outputs under various conditions (e.g., a particular output length). For example, the circuit 120 may be further configured to map each input to a coded representation for presentation in the signal BITSTREAM. In one example, the mapping may be performed using a recursive process.

The pre-processing block 122 may be configured to perform the reverse of the process performed by the block 120 when decoding the signal BITSTREAM. The circuit 122 may have a first input that may receive the signal BITSTREAM, a second input that may receive the signal SIDE_INFO and an output that may present the signal SEQ recovered from the signal BITSTREAM. The circuit 122 may be configured to generate the signal SEQ in response to the signals BITSTREAM and SIDE_INFO.

The circuit 124 may comprise, in one example, a VLC entropy coder circuit (or block). The circuit 124 may be implemented using conventional techniques. The circuit 126 may comprise, in one example, a VLC decoder circuit (or block). The circuit 126 may be implemented using conventional techniques. The circuit 120 and the circuit 124 may be combined (or coupled) to form an encoder portion of the system 100'. The circuit 122 and the circuit 126 may be combined (or coupled) to form a decoder portion of the system 100'. In general, the circuits 124 and 126 are optional.

In one embodiment, the present invention may be implemented as a stand alone encoder and/or decoder (encoder/decoder) rather than a post-processing and pre-processing steps (or blocks) of a VLC encoder/decoder. For example, instead of indexing VLC code word concatenations, the circuit 100' may be configured to index directly the input signals that are traditionally coded with VLCs. The indexed signals may be further encoded (or compressed) using an adaptive entropy coder.

The transmission and/or storage medium 128 may be configured to couple the circuits 120 and 122. The transmission and/or storage medium 126 may comprise a network (e.g., ethernet, IEEE 1394, USB, etc.), broadcast (e.g., cable, satellite, etc.) and/or a storage device (e.g., optical drive, hard drive, personal data recorder, etc.). The transmission and/or storage medium 128 may be implemented using conventional techniques.

The present invention may provide a method and/or apparatus for efficient entropy coding. A system employing the technology of the present invention may, in one example, work in conjunction with conventional VLC-based entropy coding systems as a post-processing step at an encoder and/or a pre-processing step at a decoder (e.g., the circuits 120 and 122 in FIG. 2). In another example, a system employing the technology of the present invention may work independently as a stand-alone entropy coding system (e.g., the system 100 of FIG. 1).

In general, the conventional system of performing entropy coding of the input signal via concatenation of code words from a number of VLC tables may be treated as a black box. The present invention presumes that all the VLCs are prefix codes, because from an information theory perspective all uniquely decodable VLCs have to satisfy the Kraft's inequality and, therefore, there is no advantage to not satisfy the prefix condition. Consequently, all existing entropy coding systems employing VLCs satisfy the prefix condition. In general, the prefix condition is universally satisfied by all existing multi-media compression systems.

Based upon the syntactic and semantic constraints or when side information such as packet size is present, the number of valid code word concatenations satisfying all constraints that are already known to the decoder may be only a fraction of the number of possible code word concatenations without any constraints. In one example, all of the valid code word concatenations for each set of valid constraints may be indexed (e.g., via a one-to-one correspondence or bijection). When the index can be entropy coded to a stream shorter than the original concatenation, compression performance better than conventional approaches may be achieved.

For example, in the case of a simple VLC table with five code words "0", "10", "110", "1110" and "1111", if one already knows (e.g., via side information) that the bit stream to be transmitted is 3-bits long, only four code word concatenations (e.g., "000", "010", "100" and "110") are possible. Since only four concatenations are possible, 2 bits at most (as opposed to the original 3-bit bitstream) may be used to signal (or communicate) to the decoder which one of the four concatenations was sent.

In general, although the number (e.g., m) of valid concatenations (e.g. "000", "010", "100" and "110" in the previous example) may be only a fraction of the total number (e.g., n) of possibilities without any constraints (e.g., 8 possibilities in the previous example, "000", "001", "010", "011", "100"; "101", "110", "111"), the absolute value of m may still be an extremely large number. In addition, the entropy, as represented by the side information (e.g. total length in the previous example), may also be significant. For example, typical code word concatenations can be tens, hundreds or even thousands of bits long. Therefore, directly storing all valid concatenations associated with each set of specific side information is generally not possible (or practical). For example, for packet sizes on the order of hundreds of bits, the number of valid concatenations may be about $2^{150}$. The present invention generally provides a method to facilitate the encoding and/or decoding process that may use one or more tables containing a list of the number of valid sequences for each sequence length, instead of the actual code word sequences.

In one example, an encoding and/or decoding process may be implemented to order (or arrange) the m valid concatenations in lexicographical (or dictionary) order. Since each of the code words in the concatenation is from a prefix code table (e.g., in the above example, {"000", "010", "100" and "110"}), if the code words are arranged lexicographically in the code table, all concatenations that begin with a lexicographically smaller code word (e.g., c1) will always be smaller than code word concatenations that begin with a lexicographically larger code word (e.g., c2). In the above example, code word concatenations "000" and "010" which begin with code word "0" are smaller than code word concatenations "100" and "110" which begin with a code word larger than "0" (e.g., "10" or "11", respectively).

In general, the total number of L-bit code word concatenations that begin with the code word c1 is the total number of valid code word concatenations that are L−|c1| bits long, where |c1| represents the length (in bits) of the code word c1. For example, the number of 3-bit code word concatenations that begin with the code word "0" is the number of 2-bit code word concatenations. Therefore, to decode the signal corresponding to the k-th valid concatenation of L-bits, the decoder may be configured to compare k with the total number n(L−|c1|) of valid code words of length L−|c1| bits. In one example, when the index (e.g., k) is less than or equal to the total number of valid code words of length L−|c1| bits (e.g., k<=n(L−|c1|)), the first code word to be decoded in the concatenation is c1.

In another example, when the index k is greater than n(L−|c1|), but less than or equal to the total number of valid code words of length L−|c1| bits plus the total number of valid code words of length L−|c2| bits (e.g., k<=n(L−|c1|)+n(L−|c2|)), the first code word is c2; and so on. After the first code word in the concatenation has been determined, the difference between the indices associated with the first valid concatenation and the concatenation remaining to be decoded may be deducted from the index k, the length of the concatenation may be reduced by the length of the first code word, and the decoding procedure may be repeated (e.g., recursively) until the entire concatenation is decoded.

In general, a decoder may reconstruct the L-bit long code word concatenation by simply storing a table of the numbers of valid code word concatenations for each specific set of constraints or side information (e.g., length of the concatenation to be decoded in the above example) without actually storing any of the actual valid concatenations, and performing j comparisons, where j is the total number of code words in the concatenation to be decoded. Only the corresponding index and the specific set of constraints and side information (if not known by the decoder through any other means) are stored or transmitted. The operation of the encoder is generally the reverse of the decoding procedure described above.

In real systems, code words from multiple VLC tables may be interleaved. For example, in H.263 video coding macroblocks may be represented by a "COD" bit, which may be followed by a "MCBPC" code word. The MCBPC code word may be followed by code words representing motion vectors (MVs). In such a case, code words from COD, MCBPC and MV tables are concatenated and interleaved in a predefined order (e.g., In H.263 COD/MCBPC→MVD→CBPC→DCT; In H.264 Tokens→Trailingones→LevelPrefix/LevelSuffix→TotalZeroes→RunBefores). When each of the VLC tables is a prefix VLC table, taking the entire encoding process as a black box, the equivalent code table used by the black box as a result of interleaving will still constitute a prefix VLC table. Therefore, the analysis presented above is applicable even if the encoder/decoder uses tables of higher dimensions. For example, a table could store the number of valid code word concatenations of L-bits long that begin with a code word representing motion information in video coding. In general, although the number of tables stored by the encoder and decoder increases with higher dimensional tables, as does the overhead associated with accessing higher dimensional tables, the amount of storage used to store the entries in the tables does not change significantly, as each table is smaller.

The present invention may be implemented in a variety of embodiments depending, for example, on the application, the amount of side information available, and delay/storage specifications. In one embodiment (e.g., when no external synchronization information is available and a low delay/low storage entropy coding method is desired), each code word concatenations obtained using the conventional entropy coding system may be represented as a combination of a length and an index (e.g., (Length, Index)). The length may represent the length of the code word concatenation obtained using the conventional entropy coding. The index may represent the index of the current code word concatenation to be transmitted, in lexicographical order, among all of the valid code word concatenations of the same length. Both the length and the index may be further entropy coded either jointly or separately (e.g., with conventional entropy coding schemes such as VLC, arithmetic coding (AC) or adaptive AC/VLC coding). In general, the bitrate associated with transmitting the length may be regarded as an overhead.

In another embodiment, multiple input code word concatenations may be encoded together using the present invention. Encoding multiple input code word concatenations together may be advantageous when the overhead associated with transmitting the length is considered excessive. For example, in video coding, multiple DCT (discrete cosine transform) transform blocks (e.g., that are traditionally coded by code word concatenations) may be coded together, as opposed to individually encoded with individual length and index fields. From an information theory perspective, assuming the DCT blocks are independently and identically distributed (i.i.d), as the number of transform blocks increases, the amount of bitrate savings increases linearly, while the overhead associated with transmitting the total length increases only logarithmically. When the number of blocks is sufficiently high, overall entropy coding efficiency may be improved over conventional methods.

In yet another embodiment (e.g., when there is an external synchronization mechanism such as a packet, slice, and/or frame synchronization markers widely used in video coding standards), length information may already be known to the entropy decoder. A system employing the technique of the present invention may transmit only the index information. The index information may be subject to further entropy coding for additional improvement in efficiency.

In still another embodiment (e.g., similar to the case for dictionaries where words do not have to have the same length), instead of indexing valid code word concatenations of the same length and sending the packet length as a separate entity that is transmitted separately, an overall index may be constructed counting all valid concatenations of all total lengths. An entropy coding scheme may be used to represent the indices. In one example, the encoding scheme may be adaptive, and may use the original VLC concatenation as an initial coded representation of the adaptive scheme.

Figure 3:
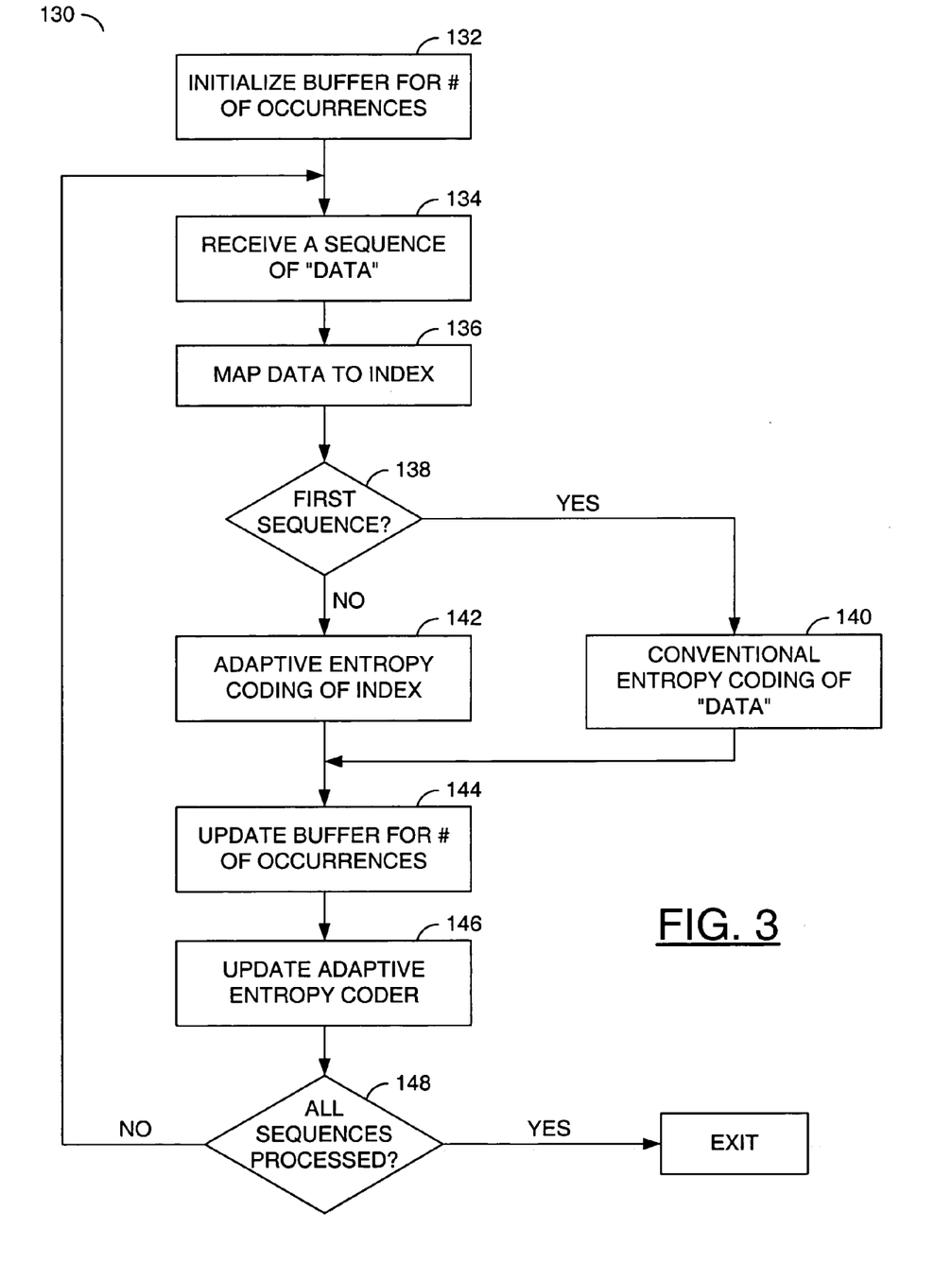
FIG. 3 is a flow diagram illustrating an adaptive entropy coding process in accordance with a preferred embodiment of the present invention.

Referring to FIG. 3, a flow diagram is shown illustrating an adaptive entropy coding process 130 in accordance with a preferred embodiment of the present invention. The process 130 may comprise a state 132, a state 134, a state 136, a state 138, a state 140, a state 142, a state 144, a state 146 and a state 148. The state 132 may be implemented as an initialization state. The state 134 may be implemented as a data reception state. The state 136 may be implemented as a data mapping state. The state 138 may be implemented as a decision state. The state 140 may be implemented as a conventional coding state. The state 142 may be implemented as an adaptive coding state. The state 144 may be implemented as a buffer update state. The state 146 may be implemented as a coder update state. The state 148 may be implemented as a decision state.

In one example, the process 130 may be implemented as part of an encoder routine or block. The process 130 may begin in the state 132. In the state 132, the process 130 may initialize a buffer for storing the number of times a particular sequence of data is received (or seen) by the encoder. For example, the buffer may have an entry (e.g., a bin) for each possible sequence of data that may be updated (e.g., incremented) each time the respective sequence is received. In some cases, the number of possible sequences may be very large, or even infinite. In such a case, the buffer may be configured to store only the most frequently encountered inputs (e.g. as determined by the inputs corresponding to the shortest coded representations in a conventional scheme). The buffer may be dynamically adjusted based on the information at hand (e.g., an input designated as frequently encountered in the traditional scheme, if rarely seen in the actual information processed, may drop out of the list).

When the buffer has been set up, the process 130 may move to the state 134. In the state 134, the process 130 may wait to receive a sequence of data. The term data generally refers to, but is not limited to, code words, symbols, numeric data and other information (e.g. motion vectors, etc.) that may be directly entropy coded. When a sequence of data is received, the process 130 may move to the state 136. In the state 136, the process 130 may map the data sequence to an index value. When the data sequence has been mapped to an index, the process 130 may move to the state 138. In the state 138, the process 130 generally determines whether the data sequence that was mapped to the index is the first sequence of data to be transmitted or stored. When the data sequence is the first sequence, the process 130 moves to the state 140, where the data is coded using a conventional entropy coding technique. When the data sequence is not the first sequence, the process 130 moves to the state 142, where the index is coded using an adaptive entropy coding technique.

When either the data sequence or the index have been coded (e.g., the blocks 140 and 142), the process 130 may move to the state 144. In the state 144, the entry in the buffer for the particular data sequence is updated. When the entry in the buffer of the number of occurrences has been updated, the process 130 may move to the state 146. In the state 146, the process 130 may update the adaptive entropy coder. In one example, the process of updating the adaptive entropy coder may include updating a probability model, a context model and/or other models depending on the nature of the adaptive entropy coding scheme used for the indices (e.g. adaptive Huffman coding, context based adaptive arithmetic coding (CABAC), context based adaptive variable length coding (CAVLC), etc.).

In a preferred embodiment, the encoder may be configured to perform adaptive Huffman coding or arithmetic coding for the most frequently encountered inputs (or equivalently, indices), and add a single bit to each output bit stream. For example, the encoder may be configured to add a single one bit (e.g., "1") before the output of the adaptive entropy coding of the most frequently encountered inputs, while adding a single zero bit (e.g., "0") in front of the coded representation of the rest of the inputs, which may be coded with either fixed length code or conventional entropy coding.

When the adaptive entropy coder has been updated, the process 130 may move to the state 148. In the state 148, the process 130 may check to determined whether all data sequences have been processed. When all of the data sequences have not been processed, the process 130 returns to the state 134. When all of the data sequences have been processed, the process 130 generally ends.

Figure 4:
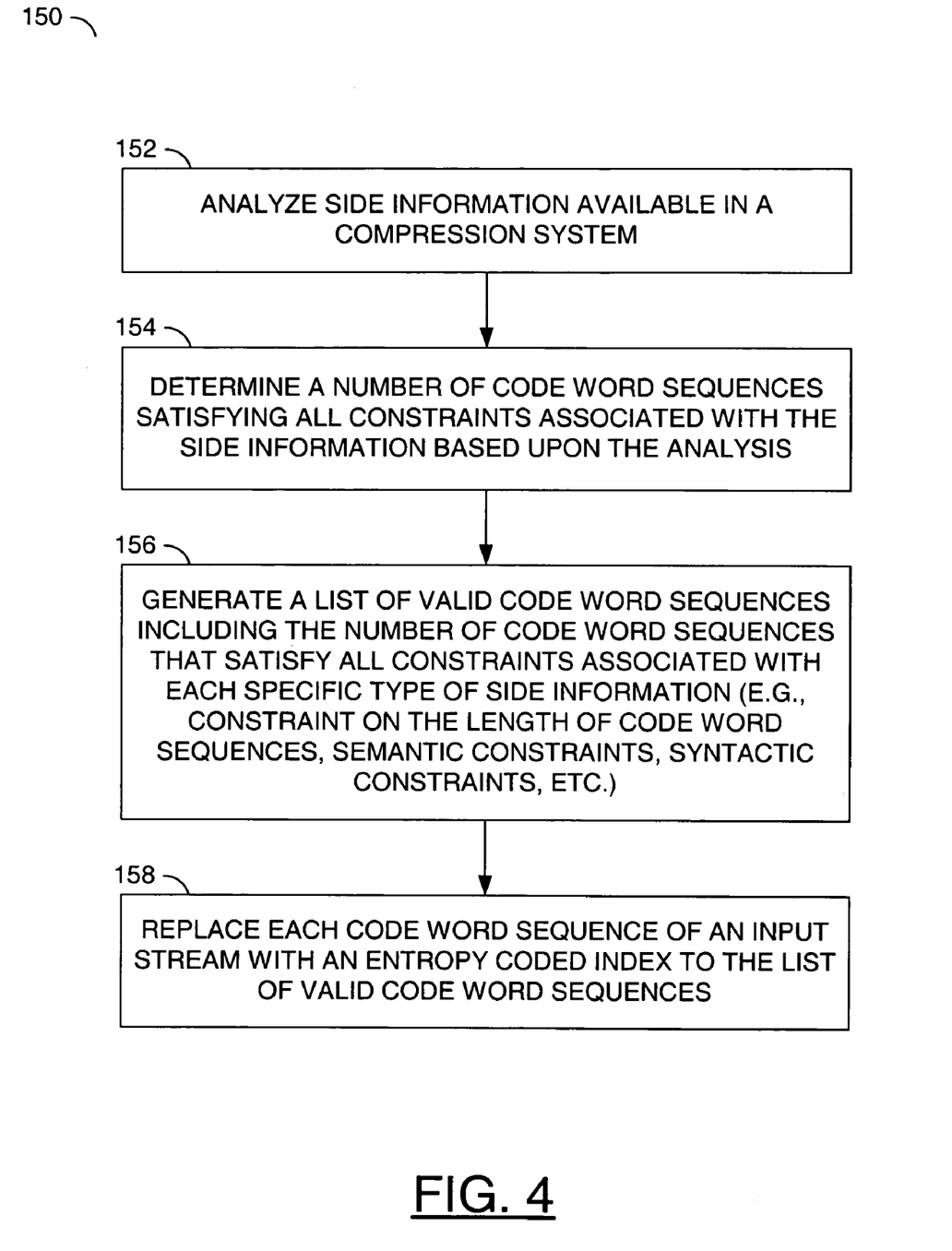
FIG. 4 is a flow diagram illustrating an entropy coding scheme in accordance with a preferred embodiment of the present invention.

Referring to FIG. 4, a flow diagram is shown illustrating an entropy coding process 150 in accordance with a preferred embodiment of the present invention. The process 150 may comprise a state 152, a state 154, a state 156 and a state 158. The state 152 may be implemented as an analysis state. The state 154 may be implemented as a determination state. The state 156 may be implemented as a list generating state. The state 158 may be implemented as a coding state. In one example, the states 152, 154 and 156 may be implemented as a separate process from the state 158. In another example, when the entropy encoding implemented is highly adaptive (e.g., dynamic context building, etc.) dynamic generation of the tables during encoding/decoding may be more cost effective than storing, for example, 20,000 different tables for different contexts. In a preferred embodiment, the states 152, 154 and 156 occur offline (or independently) from the encoding/decoding of bit streams.

The process 150 may start in the state 152. In the state 152, the side information (e.g., length of code word concatenations, semantic and syntactic constraints, etc.) may be analyzed. In one example, the analysis may involve software configured to determine the amount of redundancy in a system. In one example, the analysis may be performed offline. When the side information has been analyzed, the process 150 may move to the state 154. In the state 154, the results of the analysis of the side information may be used to determine the number of code word concatenations that satisfy all constraints associated with all of the side information. The process 150 may move from the state 154 to the state 156.

In the state 156, a list (or table) of the number of code word concatenations that satisfy all constraints associated with each specific type of side information may be generated. When the list has been generated, the process 150 may move to the state 158. In the state 158, the process 150 may use the list in a first mode for encoding and in a second mode for decoding. When the list is used in the first mode, the process 150 may replace each code word sequence in an input stream with an index into the list. In one example, the index may be subject to further entropy coding. When the list is used in the second mode, the process 150 may reverse the encoding process by determining a code word sequence corresponding to each entropy coded index in an input stream.

In general, the tables generated comprise a list of the number of valid sequences for each sequence length (e.g., five 3-bit code word sequences, two 5-bit code word sequences, etc.), rather than a list of the actual valid sequences of code words. However, in a system where the table is small, the concatenations may be stored directly. In one example, for packet sizes of hundreds of bits, the number of valid concatenations may be about $2^{150}$. The present invention generally provides an advantage by allowing determination of a sequence corresponding to an index without ever having to store any actual sequences.

In one example, using the simple code book from above with 5 code words "0", "10", "110", "1110", "1111", an encoder and/or a decoder may be implemented with a table (or list) similar to the following TABLE 1:

TABLE 1

| Length | No. of valid code word sequences of Length bits |
|---|---|
| 1 | 1 |
| 2 | 2 |
| 3 | 4 |
| ... | ... |

For the five code words, there is one valid code word sequence that is 1-bit long ("0"), there are two valid sequences that are 2-bits long ("00" and "10"), there are four valid sequences that are 3-bits long ("000", "010", "100", "110"), etc.

To facilitate faster access to the table, the table may also be indexed by both sequence length and number of code words included in the sequence (and/or other information useful for partitioning a large table to smaller tables). In one example, the table may be indexed using length and number of code words of a sequence as illustrated in the following TABLE 2:

TABLE 2

| Length/number of code words | Number of valid code word sequences of Length bits |
|---|---|
| 1/1 | 1 |
| 2/1 | 1 |
| 2/2 | 0 |
| 3/1 | 1 |
| 3/2 | 2 |
| 3/3 | 1 |
| ... | ... |

The order of the values in the table is not necessarily the same as the order of the values stored in the memory.

In determining the number of valid code word sequences for any given sequence length, a recursive procedure similar to one used in encoding/decoding may be employed. In one embodiment, an analyzer may construct the table recursively using an equation similar to that described by the following equation (expressed using LaTex document preparation system format):

$N(L,1)=\sum_{j: |c_j|=L}$
$N(L,m)=\sum_j N(L-c_j, m-1)$ m>1
and
$N(L)=\sum_m N(L,m)$, where $N(L,1)$ is the number of valid L-bit long code word sequences with one code word (which is equal to the number of code words that are L-bit long), $N(L,m)$ is the number of valid L-bit code word sequences with m code words, and $N(L)$ is the number of valid L-bit code word sequences with any number of code words.

An alternative method of constructing the tables using the equations is to map a code book to a polynomial $g(x)$ of a variable x:

$g(x)=\sum_j n_j x^j$, where $n_j$ is the number of code words in the code book that are of length j bits. Using the example above of the code book with five code words, the numbers of code word concatenations of various total length but each containing k code words may be derived by raising $g(x)$ to the k-th order (e.g., $g^k(x)$). The number of sequences of length l-bits is the coefficient of the term $x^l$ in the polynomial of $g^k(x)$.

The correspondence between code word concatenations and polynomial multiplication may provide significant improvement in the speed for calculating the number of valid sequences because polynomial multiplication may be implemented with fast algorithms (e.g., by using Fast Fourier Transforms). The approach of using polynomial multiplication may also be adapted to take into account syntactic and semantic constraints that are manifested numerically. For example, in H.263, quantized DCT coefficients are encoded with run-length coding and then represented by code words designating a 3-tuple (e.g., RUN, LEVEL, LAST) of information, where (i) RUN is the number of consecutive zeros in zig-zag order between the last non-zero coefficient in the transform block and the current non-zero coefficient of value LEVEL and (ii) LAST is a single bit designating whether the current non-zero coefficient is the last non-zero coefficient of the block. When there are at most 64 coefficients in a transform block, the sum of the total number of (RUN, LEVEL, LAST) code words (which is equal to the total number of non zero coefficients in the block) and the sum of all RUN values should be less than or equal to 64.

To represent this restriction when calculating the number of valid code word sequences for DCT information in H.263, a polynomial may be constructed as follows:

$$g(x,y,z)=\sum_i x^{|c_i|} y^{\{run_i+1\}} z^{\{LAST_i\}}$$

where $|c_i|$ is the length of the i-th code word in the code book, $run_i$ is the RUN value and $LAST_i$ is either 1 or 0 for the information represented by $c_i$. The number of valid k-code word sequences satisfying the aforementioned constraint may be determined by raising $g(x,y,z)$ to the k-th power and looking at only the terms with the power of y less than or equal to 64, and the power of z equal to 1.

Figure 5:
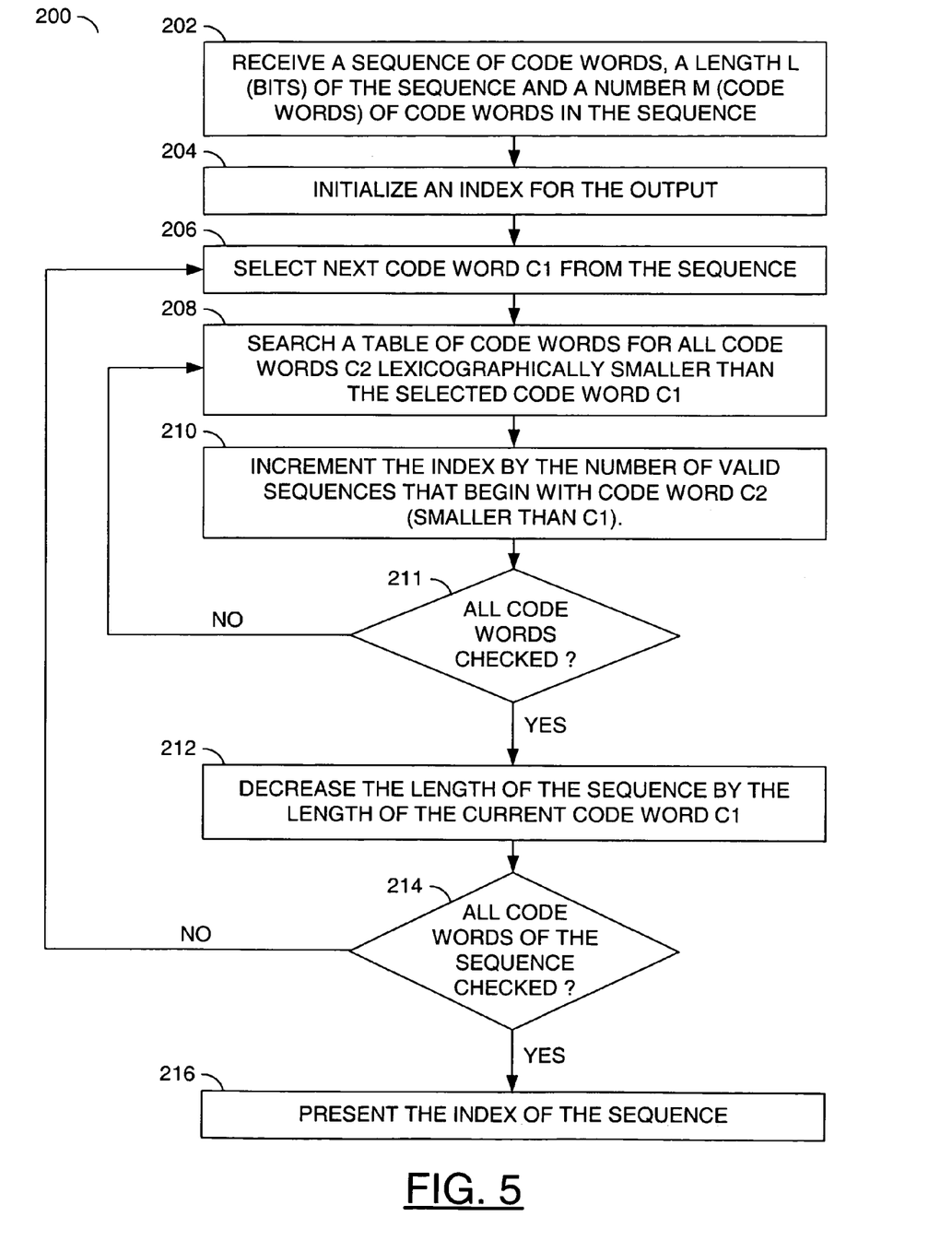
FIG. 5 is a flow diagram illustrating an encoding scheme in accordance with the present invention.

Referring to FIG. 5, a flow diagram is shown illustrating an encoding process 200 in accordance with a preferred embodiment of the present invention. The process 200 may comprise a state 202, a state 204, a state 206, a state 208, a state 210, a state 211, a state 212, a state 214 and a state 216. The state 202 may be implemented as a data reception state. The state 204 may be implemented as a variable initialization state. The state 206 may be implemented as a selection state. The state 208 may be implemented as a table search state. The state 210 may be implemented as an incrementation state. The state 211 may be implemented as a decision state. The state 212 may be implemented as a sequence length decrementing state. The state 214 may be implemented as a decision state. The state 216 may be implemented as a presentation state.

In the state 202, the process 200 may receive a sequence of code words, a value (e.g., L) representing a length of the sequence (e.g., in bits) and a value (e.g., M) representing the number of code words in the sequence. When the sequence of code words and the data describing the sequence have been received, the process 200 may move to the state 204. In the state 204, a variable for outputting an index may be initialized (e.g., to 0). When the index is initialized, the process 200 may move to the state 206. In the state 206, the process 200 selects the next code word (e.g., C1) from the sequence to be encoded. For example, when the state 206 is entered from the state 204, the first code word of the sequence is selected.

Upon selection of the code word to be encoded, the process 200 moves to the state 208. In the state 208, a search of a table of code words is performed for all code words (e.g., C2) lexicographically smaller than the selected code word C1. When a lexicographically smaller code word C2 is found in the table, the process 200 moves to the state 210. In the state 210, the index is incremented by the number of valid sequences that begin with the lexicographically smaller code word C2 and have the same total sequence length in bits. When the index has been incremented, the process 200 moves to the state 211. In the state 211, a check is made to determine whether all code words lexicographically smaller than the code word C1 in the table have been checked. If all the code words have not been checked, the process 200 returns to the state 208.

When all code words lexicographically smaller than the code word C1 in the table have been checked, the process 200 moves to the state 212. In the state 212, the length L of the sequence being encoded is decreased by the length of the current code word C1 and the process 200 moves to the state 214. In the state 214, the process 200 determines whether all code words of the sequence have been checked. When all the code words in the sequence to be encoded have not been checked (e.g., the current length of the sequence is greater than 0), the process 200 returns to the state 206 to select the next code word. Otherwise, the process 200 moves to the state 216. In the state 216, the index for the sequence to be encoded may be presented (or output).

In another preferred embodiment of the present invention, the search referred to in the block 208 may be performed offline to produce a table comprising the total number of code word sequences that begins with all code words that are lexicographically smaller than a given code word. When performing encoding, upon knowing the code word to be encoded, the index can be incremented by the total from the table, as opposed to generating the total through a loop as designated by the states 208–211.

Figure 6:
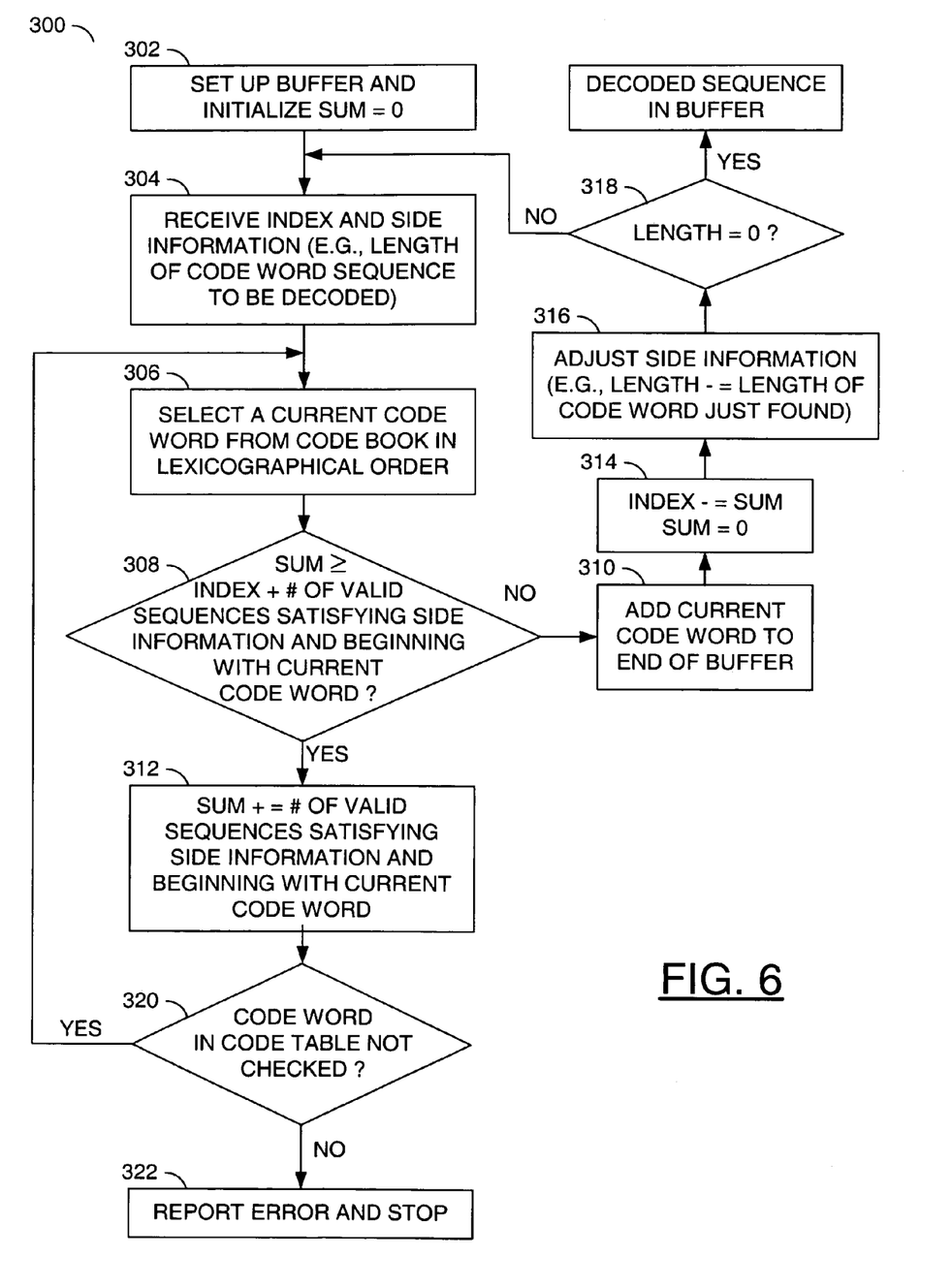
FIG. 6 is a flow diagram illustrating a decoding scheme in accordance with the present invention.

Referring to FIG. 6, a flow diagram is shown illustrating a decoding process 300 in accordance with a preferred embodiment of the present invention. The process 300 may include a number of states 302–322. The state 302 may be implemented as an initialization state. The state 304 may be implemented as a data reception (or input) state. The state 306 may be implemented as a selection state. The state 308 may be implemented as a decision state. The state 310 may be implemented as a buffer update state. The state 312 may be implemented as a variable adjusting state. The state 314 may be implemented as an index update state. The state 316 may be implemented as a side information adjustment state. The state 318 may be implemented as a decision state. The state 320 may be implemented as a decision state. The state 322 may be implemented as an error reporting state.

In the state 302, the process 300 may begin by setting up a buffer for storing code words of a sequence being decoded and initializing a variable (e.g., SUM) representing the number of valid code word sequences that (i) satisfy side information and constraints and (ii) start with a code word smaller than a particular code word in the code table (e.g., setting SUM to zero). From the state 302, the process 300 may move to the state 304. In the state 304, the process 300 may receive an index and side information (e.g., the length of the code word sequence to be decoded, etc.). When the index and the side information have been received, the process 300 may move to the state 306.

In the state 306, the process 300 may select a code word from a code book (or table) in lexicographic order. When the code word is selected, the process 300 move to the state 308. In the state 308, the process 300 compares the variable SUM with the value of the index plus the number of valid code word sequences satisfying the side information and beginning with the current code word. When the variable SUM is less than the value of the index plus the number of valid code word sequences satisfying the side information and beginning with the current code word, the process 300 moves to the state 310. When the variable SUM is greater than or equal to the value of the index plus the number of valid code word sequences satisfying the side information and beginning with the current code word, the process 300 moves to the state 312.

In the state 310, the process 300 adds the selected code word to the end of the buffer and moves to the state 314. In the state 314, the process 300 subtracts the value of the variable SUM from the value of the index and resets the variable SUM to zero. When the values of the variable SUM and the index have been updated, the process 300 moves to the state 316. In the state 316, the process 300 may adjust the side information (e.g., subtracting the length of the current code word just found from the length of the code word sequence to be decoded) and move to the state 318. In the state 318, the process 300 checks the length of the code word sequence that remains to be decoded. When the length of the code word sequence to be decoded is still greater than zero, the process 300 moves to the state 304. When the length of the code word sequence to be decoded is zero, the process 300 may terminate with the decoded code word sequence contained in the buffer.

In the state 312, the process 300 adds the number of valid sequences satisfying the side information and beginning with the current code word to the variable SUM. When the variable SUM has been updated, the process 300 moves to the state 320. In the state 320, the process 300 checks to determine whether any code words in the code book have not been checked. When code words remain to be checked, the process 300 moves to the state 306. When no more code words remain to be checked, the process 300 moves to the state 322. In the state 322, the process 300 may report an error condition and stop.

The present invention generally provides a new method for entropy coding without actually directly using the code word concatenations as in conventional systems. The present invention generally takes into account side information available in a real multimedia compression system. The side information is generally ignored in the design of entropy coding tables in conventional approaches. However, in real applications, side information such as packet length or slice size is available. Given such side information, for each specific input, a shorter representation of the input, that would have violated the Kraft's inequality in the absence of the side information may often be found.

In general, for error resilience purposes, all side information should be utilized at the decoder. However, even though such side information is often also present in the error free cases, such information has not been used to significantly improve entropy coding efficiency. The present invention generally provides a technology that may be adopted widely and have a long-lasting impact on multimedia coding standards and products. The present invention may provide technology that may become part of a new version of the H.264/H.265 standard and lead to significant gain in coding efficiency.

The function(s) performed by the flow diagrams of FIGS. 3–6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s). Example encoding and decoding processes are illustrated by the pseudo code presented below. The symbols used in the following pseudo code may be interpreted according to the following definitions:

| SYMBOL | DEFINITION |
| --- | --- |
| C[ ] | VLC table, constant |
| \|C[ ]\| | Number of codewords in the table |
| C[i] | The i-th codeword, lexicographical order |
| I(c) = I | The index of one codeword c |
| \|c\| | The length of one codeword c |
| L | The length of a sequence |
| n(l) | Number of valid sequences with length l |
| S[ ] | Array of input symbols or code words |
| m | Number of code words/symbols in S[ ] |
| l | Length of S in bits (in the case where S is a sequence of symbols, length of S when coded with VLCs/AC) |

In one example, a sequence of code words may be encoded as an index using a process illustrated by the following pseudo code:

```
int encode2index(int l, int m, *sequence S)
//int l: length of the sequence S
//int m: number of codewords in the sequence S
{
    int k=0; //return value, the index of this sequence
            within the total of N(l)
    int ll = l;
    int ii,j;
    for(ii = 0; ii < m; ii++) //for each codeword in the
    sequence
    {
        for(j = 0; j < I(S[ii]); j++) //for all codewords
        in the codeword table that are smaller than the
        current codeword, lexicographically
            k += n(ll-|C[j]|); //add the index with the
            number of those valid sequences.
        ll -= |C[ii]|; //remove the current codeword length
        from the sequence length
    }
    return k;
}
```

In one example, a bit stream may be decoded into a sequence of code words using a process illustrated by the following pseudo code:

```
// void decode2codewords(int k, int l, int *m *bitstream S)
//int k: input, index of this sequence within the total of
n(l)
//int l: input, length of the sequence S
//int *m: output, to store the number of codewords in the
sequence S,
//          need to be initialized as *m = 0 before calling
this function first time.
// bitstream S: output, to store the codewords in the sequence
S.
{
    int ll = l;
    int ii;
    for(ii = 0; ii <|C[ ]|; ii++) //check within the VLC
    table for all the codewords
    {
        if(k < n(1-|C[ii]|)) //within the range, the
        codeword is found
        {
            S[*m] = C[ii]; //get the codeword
            (*m)++; //increase the codeword count in the
            sequence
            ll -= |C[ii]|; //decrease the sequence length
            if(ll==0) return; //finish
            else decode2codewords(k,nn,m,S); //continue
            for recursion
        }
        else k-= n(l-|C[ii]|); //try the other ranges
    }
}
```

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs,

The invention claimed is:

1. A method for performing entropy coding comprising the steps of:
   receiving an input stream and side information;
   analyzing said side information to determine all constraints associated with said side information;
   replacing said input stream with an index to a list of a number of valid input streams that satisfy all constraints associated with each specific type of said side information; and
   generating said list of the number of valid input streams that satisfy all constraints associated with each specific type of side information based on an amount of redundancy in a system.

2. The method according to claim 1, wherein said input stream comprises one or more types of streams selected from a group consisting of bit streams, streams of symbols and numeric data streams.

3. The method according to claim 2, wherein said side information comprises one or more parameters selected from a group consisting of a length of the bit streams in bits and a number of symbols contained in a received packet.

4. The method according to claim 3, wherein said length of the bit streams in bits comprises a number of bits of a coded representation when said input stream is encoded using either variable length coding or adaptive coding.

5. The method according to claim 3, wherein the length of the bit streams in bits is (i) communicated via a side channel, (ii) communicated through an individually encoded representation for length as overhead, or (iii) represented as part of an entropy coded combination of length and index information.

6. The method according to claim 1, further comprising the step of entropy coding said index.

7. The method according to claim 1, wherein said list is generated offline.

8. The method according to claim 1, further comprising the steps of:
   organizing the list of the number of valid input streams that satisfy all constraints in lexicographical order; and
   identifying said index for said input stream via a predetermined recursive process.

9. The method according to claim 8, wherein the predetermined recursive process comprises the steps of:
   (A) setting said index to zero;
   (B) determining a total length corresponding to a code word sequence that would have had to be transmitted or stored in a predetermined conventional system;
   (C) incrementing said index by a value determined by the number of valid code word sequences from said predetermined conventional system starting with a current first code word and having a length equal to said total length less a length of said current first code word; and
   (D) removing the current first code word from the sequence; and
   (E) repeating the steps (C) and (D) until all code words in the sequence are processed.

10. The method according to claim 1, wherein said side information comprises syntactic and semantic constraints.

11. The method according to claim 1, further comprising the step of:
   storing said list in a look-up table as a function of all specific types of side information.

12. The method according to claim 1, further comprising the steps of:
   organizing said list in lexicographical order; and
   identifying each of a plurality of input streams with an input index.

13. The method according to claim 12, wherein said input streams comprise one or more types of coded representations selected from a group consisting of variable length codes (VLCs), fixed length codes (FLC), arithmetic coded (AC) bit streams, adaptive AC bit streams and adaptive VLC streams.

14. The method according to claim 12, wherein the step of identifying each input stream with said input index comprises the steps of:
   determining the number of valid input streams of a predetermined length that start with a first code word or input symbol based upon the number of valid sequences of code words or input symbols having a length equal to said predetermined length minus a length of said first code word or input symbol; and
   determining the number of the valid code word or input symbol sequences that begin with code words or input symbols smaller than a second code word or input symbol based upon a sum of the number of valid code word or input symbol sequences of said predetermined length that start with said first code word or input symbol for all first code words or input symbols smaller than said second code word or input symbol in lexicographical order.

15. The method according to claim 14, further comprising the steps of:
   determining the first code word or input symbol in the sequence of code words or input symbols associated with said input index by comparing said input index with the number of valid code word or input symbol sequences of said predetermined length that start with each code word or input symbol in a table of all code words or input symbols, wherein said first code word or input symbol in said sequence is determined as the smallest code word or input symbol such that said input index is less than the number of valid code word or input symbol sequences of said predetermined length that start with a code word or input symbol that is smaller than said first code word or input symbol;
   removing said first code word or input symbol from the sequence of code words or input symbols associated with said input index by decreasing the predetermined length by the length of said first code word or input symbol and decreasing the input index by the number of valid code word or input symbol sequences of said predetermined length that start with the largest code word or input symbol in the table that is smaller than the first code word or input symbol just determined in lexicographical order; and
   determining the remaining code words or input symbols in the sequence associated with the input index by repeating the above steps until the predetermined length is decreased to zero.

16. The method according to claim 1, further comprising the step of:
   generating conditional tables based upon each specific set of constraints and conditions.

17. The method according to claim 1, wherein each input stream comprises multiple individual bit or symbol streams.

18. The method according to claim 1, wherein an overall index for all valid input streams satisfying a variety set of conditions is constructed and entropy coded with static or adaptive variable length codes or arithmetic codes.

19. The method according to claim 1, wherein said list of the number of valid input streams that satisfy all constraints associated with each specific type of said side information is generated by mapping a code book or a dictionary of input symbols to a polynomial function.

20. The method according to claim 1, wherein said list of the number of valid input streams that satisfy all constraints associated with each specific type of said side information further comprises a number of code words or input symbols in each input stream that satisfies all constraints associated with each specific type of said side information.

21. A computer readable medium comprising instructions for performing the method according to claim 1.

22. The computer readable medium according to claim 21, further comprising instructions for generating said list of the number of valid input streams that satisfy all constraints associated with each specific type of said side information.

23. A method for performing entropy coding comprising the steps of:

receiving an input stream and side information;

analyzing said side information to determine all constraints associated with said side information; and replacing said input stream with an index to a list of a number of valid input streams that satisfy all constraints associated with each specific type of said side information, wherein (i) said input stream comprises one or more types of streams selected from the group consisting of bit streams, streams of symbols and numeric data streams and (ii) said side information comprises one or more parameters selected from the group consisting of a length of the bit streams in bits and a number of symbols contained in a received packet.

24. A method for performing entropy coding comprising the steps of:

receiving an input stream and side information;

analyzing said side information to determine all constraints associated with said side information;

replacing said input stream with an index to a list of a number of valid input streams that satisfy all constraints associated with each specific type of said side information;

organizing said list in lexicographical order; and identifying each of a plurality of input streams with an input index.

25. A method for performing entropy coding comprising the steps of:

receiving an input stream and side information;

analyzing said side information to determine all constraints associated with said side information;

replacing said input stream with an index to a list of a number of valid input streams that satisfy all constraints associated with each specific type of said side information; and generating conditional tables based upon each specific set of constraints and conditions.

26. A method for performing entropy coding comprising the steps of:

receiving an input stream and side information;

analyzing said side information to determine all constraints associated with said side information; and replacing said input stream with an index to a list of a number of valid input streams that satisfy all constraints associated with each specific type of said side information, wherein said list of the number of valid input streams that satisfy all constraints associated with each specific type of said side information is generated by mapping a code book or a dictionary of input symbols to a polynomial function.

27. A method for performing entropy coding comprising the steps of:

receiving an input stream and side information;

analyzing said side information to determine all constraints associated with said side information; and replacing said input stream with an index to a list of a number of valid input streams that satisfy all constraints associated with each specific type of said side information, wherein said list of the number of valid input streams that satisfy all constraints associated with each specific type of said side information further comprises a number of code words or input symbols in each input stream that satisfies all constraints associated with each specific type of said side information.

* * * * *